United States Patent
Dai et al.

(10) Patent No.: US 10,885,825 B2
(45) Date of Patent: Jan. 5, 2021

(54) GATE DRIVING CIRCUIT, DISPALY APPARATUS AND DRIVING METHOD THEREOF

(71) Applicants: Chengdu BOE Optoelectronics Technology Co., Ltd., Sichuan (CN); BOE TECHNOLOGY GROUP CO., LTD., Beijing (CN)

(72) Inventors: Hongwei Dai, Beijing (CN); Fucheng Yang, Beijing (CN); Zheng Wang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/474,801

(22) PCT Filed: Nov. 13, 2018

(86) PCT No.: PCT/CN2018/115206
§ 371 (c)(1),
(2) Date: Jun. 28, 2019

(87) PCT Pub. No.: WO2019/096120
PCT Pub. Date: May 23, 2019

(65) Prior Publication Data
US 2020/0005698 A1    Jan. 2, 2020

(30) Foreign Application Priority Data

Nov. 16, 2017  (CN) .......................... 2017 1 1137684

(51) Int. Cl.
*G09G 3/36* (2006.01)
*G09G 3/20* (2006.01)
*G11C 19/28* (2006.01)

(52) U.S. Cl.
CPC ............. *G09G 3/20* (2013.01); *G09G 3/3677* (2013.01); *G11C 19/28* (2013.01); *G09G 2310/0267* (2013.01); *G09G 2310/0286* (2013.01)

(58) Field of Classification Search
CPC ..................................................... G09G 3/3677
(Continued)

(56) References Cited

U.S. PATENT DOCUMENTS

| 7,532,178 | B2 | 5/2009 | Lee |
| 9,530,370 | B2 | 12/2016 | Yang et al. |
| 2016/0055814 | A1* | 2/2016 | Yang .................... G09G 3/3677 345/213 |

FOREIGN PATENT DOCUMENTS

| CN | 1667678 A | 9/2005 |
| CN | 104992682 A | 10/2015 |

(Continued)

OTHER PUBLICATIONS

Office Action dated Apr. 21, 2020 issued in corresponding Chinese Application No. 201711137684.X.

*Primary Examiner* — Abdul-Samad A Adediran
(74) *Attorney, Agent, or Firm* — Nath, Goldberg & Meyer; Joshua B. Goldberg

(57) ABSTRACT

The present application provides a gate driving circuit, a display apparatus and a method of driving the same. The gate driving circuit includes a plurality of shift registers, which are divided into a first group of shift registers and a second group of shift registers. An output terminal of an A-th stage of shift register is electrically coupled to an input terminal of a (A+1)-th stage of shift register, an output
(Continued)

terminal of a (A+1)-th stage of shift register is electrically coupled to an input terminal of a (A+1+n)-th stage of shift register, a reset terminal of the A-th stage of shift register is electrically coupled to an output terminal of a (A+a+n)-th stage of shift register, and a reset terminal of the (A+1)-th stage of shift register is electrically coupled to an output terminal of a (A+a+n+1)-th stage of shift register.

20 Claims, 7 Drawing Sheets

(58) Field of Classification Search
USPC .......................................................... 345/213
See application file for complete search history.

(56) References Cited

FOREIGN PATENT DOCUMENTS

| CN | 103236273 B | 6/2016 |
|---|---|---|
| CN | 106409211 A | 2/2017 |
| KR | 10-2015-0078587 A | 7/2015 |
| KR | 10-2017-0078165 A | 7/2017 |

* cited by examiner

GATE DRIVING CIRCUIT, DISPALY APPARATUS AND DRIVING METHOD THEREOF

CROSS-REFERENCE TO RELATED APPLICATION

This is a National Phase application filed under 35 U.S.C. 371 as a national stage of PCT/CN2018/115206, filed on Nov. 13, 2018, an application claiming the benefit of Chinese Patent Application No. 201711137684.X, filed on Nov. 16, 2017, the entire contents of which are hereby incorporated by reference.

TECHNICAL FIELD

The present disclosure relates to the field of display apparatus, and particularly, to a gate driving circuit for a display panel, a display apparatus including the same and a method of driving the display apparatus.

BACKGROUND

To realize narrow bezel of display apparatuses, a gate driving circuit integrated on an array substrate (i.e., gate driver-on-array (GOA) circuit) has been developed. The GOA circuit includes a plurality of shift registers cascaded in series for generating a plurality of driving signals to perform progressive scanning through a plurality of gate lines. This is an effective way to drive an array of thin film transistor-based pixels in a display panel to display image frames one by one on the display panel.

SUMMARY

In an aspect, the present disclosure provides a gate driving circuit for a display panel, the display panel including a plurality of rows of gate lines sequentially arranged, the gate driving circuit including a plurality of shift registers, the plurality of shift registers including a first group of shift registers and a second group of shift registers, the first group of shift registers being configured to provide scanning signals for odd-numbered rows of gate lines of the plurality of rows of gate lines in the display panel, and the second group of shift registers being configured to provide scanning signals for even-numbered rows of gate lines of the plurality of rows of gate lines in the display panel, wherein the first group of shift registers includes a plurality of first subgroups of shift registers, each of which includes n shift registers, an output terminal of an A-th stage of shift register electrically coupled to an A-th row of gate line is electrically coupled to an input terminal of a (A+n)-th stage of shift register electrically coupled to a (A+n)-th row of gate line, where A is an odd number equal to or larger than 1, and n is larger than 2; the second group of shift registers includes a plurality of second subgroups of shift registers, each of which includes n shift registers, an output terminal of a (A+1)-th stage of shift register electrically coupled to a (A+1)-th row of gate line is electrically coupled to an input terminal of a (A+1+n)-th stage of shift register electrically coupled to a (A+1+n)-th row of gate line; and a reset terminal of the A-th stage of shift register is electrically coupled to an output terminal of a (A+a+n)-th stage of shift register electrically coupled to a (A+a+n)-th row of gate line, and a reset terminal of the (A+1)-th stage of shift register is electrically coupled to an output terminal of a (A+a+n+1)-th stage of shift register electrically coupled to a (A+a+n+1)-th row of gate line, where a is a natural number smaller than n/2.

In some embodiments, n is an even number larger than 2.
In some embodiments, n is equal to 4.
In some embodiments, a is equal to 1.
In some embodiments, the display panel includes a display area and a peripheral area surrounding the display area, and the first group of shift registers and the second group of shift registers are at two opposite sides of the display panel, respectively, and are in the peripheral area.

In some embodiments, the shift register includes an input sub-circuit, a pull-up sub-circuit, a pull-down sub-circuit, a pull-down control sub-circuit and a reset sub-circuit; the input sub-circuit has a control terminal coupled to an input terminal of the shift register, an input terminal coupled to a first level signal terminal, and an output terminal coupled to a control terminal of the pull-up sub-circuit, and the input sub-circuit is configured such that the input terminal and the output terminal of the input sub-circuit are electrically connected in response to a first level signal being received at the control terminal of the input sub-circuit; the pull-up sub-circuit has an input terminal coupled to a clock signal line, and an output terminal coupled to an output terminal of the shift register, and the pull-up sub-circuit is configured such that the input terminal and the output terminal of the pull-up sub-circuit are electrically connected in response to the first level signal being received at the control terminal of the pull-up sub-circuit; the pull-down control sub-circuit has a first input terminal coupled to a second level signal terminal, a second input terminal coupled to a third level signal terminal, a control terminal coupled to the control terminal of the pull-up sub-circuit, a first output terminal coupled to a control terminal of the pull-down sub-circuit, and a second output terminal coupled to the control terminal of the pull-up sub-circuit, and the pull-down control sub-circuit is configured such that the second input terminal and the first output terminal of the pull-down control sub-circuit are electrically connected in response to the first level signal being received at the control terminal of the pull-down control sub-circuit, an absolute value of a voltage of a second level signal provided by the second level signal terminal being larger than an absolute value of a voltage of the first level signal provided by the first level signal terminal, a polarity of the second level signal being the same as a polarity of the first level signal, and a polarity of a third level signal provided by the third level signal terminal being opposite to the polarity of the second level signal provided by the second level signal terminal; the pull-down sub-circuit has an input terminal coupled to the third level signal terminal, and an output terminal coupled to the output terminal of the shift register, and the pull-down sub-circuit is configured such that the input terminal and the output terminal of the pull-down sub-circuit are electrically connected in response to the first level signal being received at the control terminal of the pull-down sub-circuit; and the reset sub-circuit has a control terminal coupled to a reset terminal of the shift register, an input terminal coupled to the third level signal terminal, and an output terminal coupled to the control terminal of the pull-up sub-circuit, and the reset sub-circuit is configured such that the input terminal and the output terminal of the reset sub-circuit are electrically connected in response to the first level signal being received at the control terminal of the reset sub-circuit.

In some embodiments, the pull-up sub-circuit includes a pull-up transistor and a storage capacitor; the pull-up transistor has a gate electrode coupled to the control terminal of the pull-up sub-circuit, a first electrode coupled to the input terminal of the pull-up sub-circuit, and a second electrode coupled to the output terminal of the pull-up sub-circuit, and the pull-up transistor is configured such that the first electrode and the second electrode of the pull-up transistor are electrically connected in response to the first level signal being received at the gate electrode of the pull-up transistor; and the storage capacitor has a first terminal coupled to the gate electrode of the pull-up transistor, and a second terminal coupled to the second electrode of the pull-up transistor.

In some embodiments, the pull-down sub-circuit includes a pull-down transistor having a gate electrode coupled to the control terminal of the pull-down sub-circuit, a first electrode coupled to the input terminal of the pull-down sub-circuit, and a second electrode coupled to the pull-down terminal of the input sub-circuit, and the pull-down transistor is configured such that the first electrode and the second electrode of the pull-down transistor are electrically connected in response to the first level signal being received at the gate electrode of the pull-down transistor.

In some embodiments, the pull-down control sub-circuit includes a plurality of pull-down control transistors including a first pull-down control transistor, a second pull-down control transistor, a third pull-down control transistor, a fourth pull-down control transistor, a fifth pull-down control transistor and a sixth pull-down control transistor; the first pull-down control transistor has a gate electrode and a first electrode both coupled to the second level signal terminal, and a second electrode coupled to a gate electrode of the second pull-down control transistor; the second pull-down control transistor has a first electrode coupled to the second level signal terminal, and a second electrode coupled to the first output terminal of the pull-down control sub-circuit; the third pull-down control transistor has a gate electrode coupled to the control terminal of the pull-up sub-circuit, a first electrode coupled to the third level signal terminal, and a second electrode coupled to the first output terminal of the pull-down control sub-circuit; the fourth pull-down control transistor has a gate electrode coupled to the gate electrode of the third pull-down control transistor, a first electrode coupled to the third level signal terminal, and a second electrode coupled to the second electrode of the first pull-down control transistor; the fifth pull-down control transistor has a gate electrode coupled to the first output terminal of the pull-down control sub-circuit, a first electrode coupled to the third level signal terminal, and a second electrode coupled to the second output terminal of the pull-down control sub-circuit; the sixth pull-down control transistor has a gate electrode coupled to a control signal terminal, a first electrode coupled to the third level signal terminal and a second electrode coupled to the output terminal of the shift register; and each of the plurality of pull-down control transistors is configured such that the first electrode and the second electrode of the pull-down control transistor are electrically connected in response to the first level signal being received at the gate electrode of the pull-down control transistor.

In some embodiments, the reset sub-circuit includes a reset transistor having a gate electrode coupled to the control terminal of the reset sub-circuit, a first electrode coupled to a reference signal terminal, and a second electrode coupled to the control terminal of the pull-up sub-circuit, and the reset transistor is configured such that the first electrode and the second electrode of the reset transistor are electrically connected in response to the first level signal being received at the gate electrode of the reset transistor.

In some embodiments, the input sub-circuit includes an input transistor having a gate electrode coupled to the control terminal of the input sub-circuit, a first electrode coupled to the input terminal of the input sub-circuit, and a second electrode coupled to the control terminal of the pull-up sub-circuit, and the input transistor is configured such that the first electrode and the second electrode of the input transistor are electrically connected in response to a first level signal being received at the gate electrode of the input transistor.

As another aspect, the present disclosure provides a display apparatus, including a display panel including a plurality of gate lines, and a gate driving circuits, wherein the gate driving circuit is any one of gate driving circuits described herein, and output terminals of the plurality of shift registers in the gate driving circuit are coupled to the plurality of gate lines in one-to-one correspondence, respectively.

In another aspect, the present disclosure provides a method of driving a display apparatus, wherein the display apparatus is any one of the display apparatuses described herein, and the method includes: supplying a plurality of first initial control signals to first ones of shift registers in the first subgroups of shift registers sequentially according to sequential order of stage numbers of the first ones of shift registers in the first subgroups of shift registers; supplying a plurality of second initial control signals to first ones of shift registers in the second subgroups of shift registers sequentially according to sequential order of stage numbers of the first ones of shift registers in second subgroups of shift registers; supplying first clock signals to shift registers in the first group of shift registers sequentially according to sequential order of stage numbers of the shift registers in the first group of shift registers; and supplying second clock signals to shift registers in the second group of shift registers sequentially according to sequential order of stage numbers of the shift registers in the second group of shift registers.

In some embodiments, for clock signals input to two adjacent stages of shift registers, a clock signal for a next stage of shift register of the two adjacent stages of shift registers is delayed from a clock signal for a current stage of shift register of the two adjacent stages of shift registers by T/n; a first input second initial control signal is delayed from a first input first initial control signal by T/n, a time interval between two first initial control signals adjacent in time is 2T/n, and a time interval between two second initial control signals adjacent in time is 2T/n.

In some embodiments, T is a duration in which a clock signal is of a first level in one cycle.

In some embodiments, the first clock signal has a duty cycle in a range from 42% to 50%, and the second clock signal has a duty cycle in a range from 42% to 50%.

BRIEF DESCRIPTION OF THE DRAWINGS

The drawings, which are provided for further understanding of the present disclosure and constitute a part of this specification, serve to explain the embodiments of the present disclosure together with the following detailed description, but not to limit the present disclosure, in which.

DETAILED DESCRIPTION

The specific embodiments of the present disclosure will be described in detail below with reference to the accompanying drawings. It is to be understood that the specific embodiments described herein are intended to explain and illustrate the present disclosure, but not to limit the present disclosure.

Generally, a gate driving circuit is utilized to output scanning signals to drive an array of pixels in a display panel. The gate driving circuit includes a plurality of stages of shift registers cascaded in series. Typically, an output signal from a current stage of shift register is used to reset an output terminal of a previous stage of shift register.

However, for a stage of shift register, in a case where the duty cycle of the clock signal is excessively large (e.g., more than 40%), an outputting defect of the shift register may exist.

For this reason, the clock signal having a smaller duty cycle is used in the related art. However, due to the smaller duty cycle of the clock signal, the time for charging the pixel units in the display panel is also shortened accordingly, thereby degrading the display performance.

Therefore, there is a demand on increasing the duty cycle of the clock signal in the shift register while alleviating the outputting defect.

Figure 1:
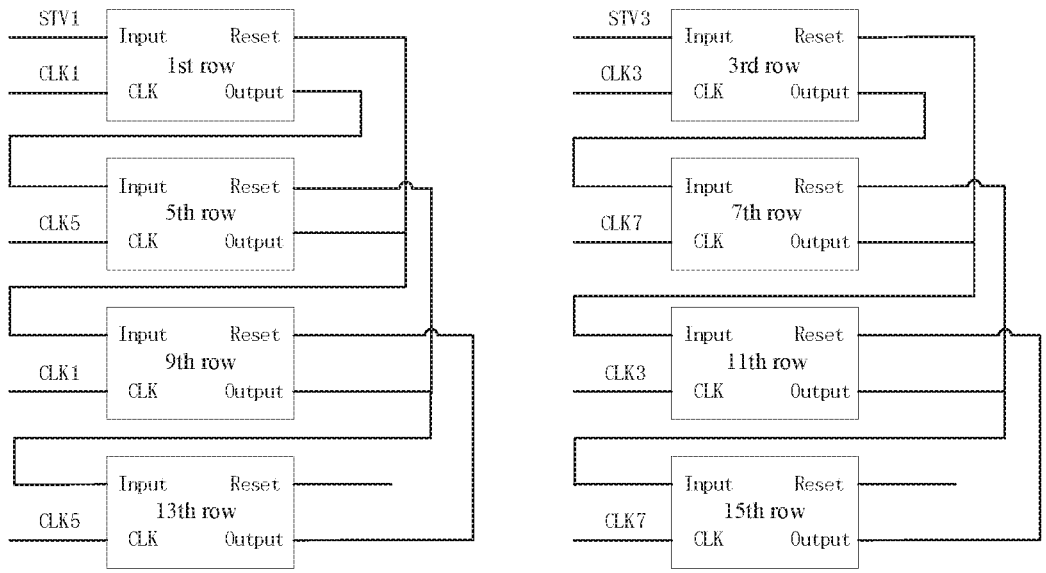
FIG. 1 is a diagram illustrating a part of an existing gate driving circuit at one side of a display panel.
Figure 2:
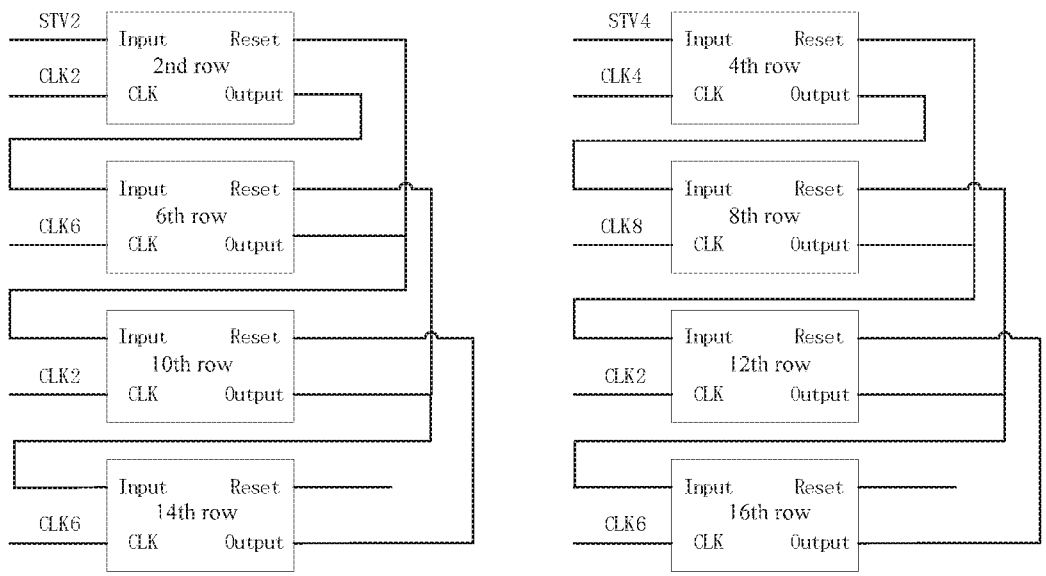
FIG. 2 is a diagram illustrating a part of the existing gate driving circuit at another side of the display panel.

FIG. 1 is a diagram illustrating a part of an existing gate driving circuit at one side of a display panel. FIG. 2 is a diagram illustrating a part of the existing gate driving circuit at another side of the display panel. The one side and the other side may be two opposite sides of the display panel, for example. For example, the gate driving circuit may be at two opposite sides of the display panel and in a peripheral area surrounding a display area of the display panel. As used herein, the term "display area" refers to an area of a display substrate (e.g., an opposing substrate or an array substrate) in a display panel where an image is actually displayed. As used herein, the term "peripheral area" refers to an area of a display substrate (e.g., an opposing substrate or an array substrate) in a display panel where various circuits and wires are provided to transmit signals to the display substrate. To increase the transparency of the display apparatus, non-transparent or opaque components of the display apparatus (e.g., battery, printed circuit board, metal frame), can be disposed in the peripheral area rather than in the display area.

As illustrated in FIGS. 1 and 2, the gate driving circuit includes a plurality of shift registers (represented by boxes), a first group of clock signal lines (CLK1, CLK3, CLK5 and CLK 7) and a second group of clock signal lines (CLK2, CLK4, CLK6 and CLK 8). The plurality of shift registers are divided into a first group of shift registers (shift registers in FIG. 1) and a second group of shift registers (shift registers in FIG. 2). The first group of shift registers is configured to provide scanning signals for odd-numbered rows of gate lines in the display panel, and the second group of shift registers is configured to provide scanning signals for even-numbered rows of gate lines in the display panel. It can be understood that the display panel includes a plurality of rows of gate lines sequentially arranged. In the present disclosure, the stage number of a shift register is the same as the row number of a gate line coupled to the shift register. For example, a shift register coupled to a "first row" of gate line is a first stage of shift register in the gate driving circuit, a shift register coupled to a "second row" of gate line is a second stage of shift register in the gate driving circuit, . . . , a shift register coupled to a "sixteenth row" of gate line is a sixteenth stage of shift register in the gate driving circuit, and so on.

In the gate driving circuit illustrated in FIGS. 1 and 2, a reset terminal Reset of an A-th stage of shift register is coupled to an output terminal Output of a (A+4)-th stage of shift register, and a reset terminal Reset of a (A+1)-th stage of shift register is coupled to an output terminal Output of a (A+5)-th stage of shift register. For example, in FIGS. 1 and 2, a reset terminal Reset of a fifth (A=5) stage of shift register is coupled to an output terminal Output of a ninth (A+4=5+4=9) stage of shift register, and a reset terminal Reset of a sixth (A+1=5+1=6) stage of shift register is coupled to an output terminal Output of a tenth (A+5=5+5=10) stage of shift register. Here, the output terminal of each shift register is configured to output an output signal as a scanning signal, and the reset terminal of each shift register is configured to receive an output signal from an output terminal of a next stage of shift register as a reset signal for resetting the current stage of shift register. In the gate driving circuit as illustrated in FIGS. 1 and 2, the output signal of a shift register is used to reset a shift register at a same side of the display panel.

It has been discovered by the inventors of the present disclosure that the duty cycle of the clock signal cannot be increased for the gate driving circuit illustrated in FIGS. 1 and 2. The reason is as follows: in the gate driving circuit, a current stage of shift register is generally reset by using a next stage of shift register, and in a case where the duty cycle of the clock signal is relatively large, a rising edge of the reset signal and a falling edge of the output signal of the shift register overlap, causing capacitive coupling effect, thereby affecting the voltage at the output terminal of the shift register.

Accordingly, the present disclosure provides, inter alia, a gate driving circuit for a display panel, a display apparatus including the same and a method of driving the display apparatus that substantially obviate one or more of the problems due to limitations and disadvantages of the related art.

Figure 3:
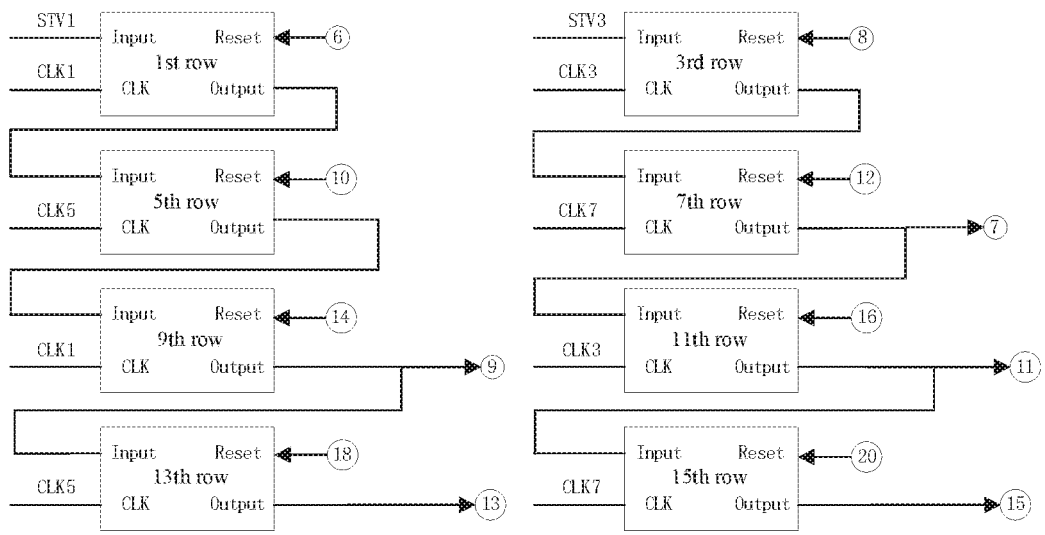
FIG. 3 is a diagram illustrating a first group of shift registers in a gate driving circuit according to an embodiment of the present disclosure.
Figure 4:
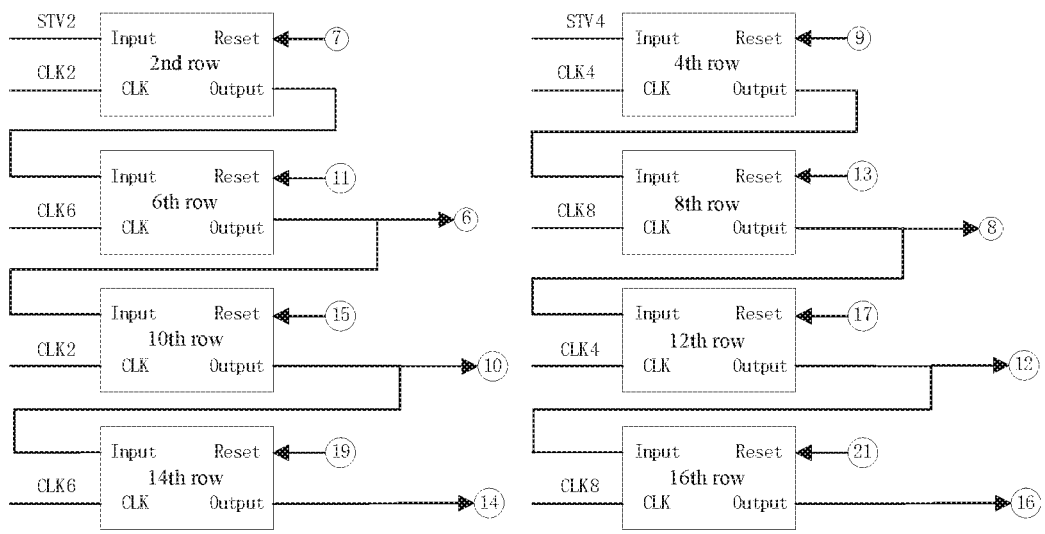
FIG. 4 is a diagram illustrating a second group of shift registers in the gate driving circuit according to an embodiment of the present disclosure.

As an aspect of the present disclosure, there is provided a gate driving circuit for a display panel, the display panel including a plurality of gate lines sequentially arranged. As illustrated in FIGS. 3 and 4, the gate driving circuit in some embodiments includes a plurality of shift registers, a first group of clock signal lines and a second group of clock signal lines. The plurality of shift registers are divided into a first group of shift registers and a second group of shift registers. The first group of shift registers is configured to provide scanning signals for odd-numbered rows of gate lines in the display panel, and the second group of shift registers is configured to provide scanning signals for even-numbered rows of gate lines in the display panel.

In some embodiments, the first group of clock signal lines includes a plurality of first clock signal lines (e.g., n first clock signal lines), the first group of shift registers includes a plurality of first subgroups of shift registers, each of which includes n shift registers, the n shift registers in a same first subgroup of shift registers are coupled to n first clock signal lines in one-to-one correspondence, respectively, and an output terminal of an A-th stage of shift register is electrically coupled to an input terminal of a (A+n)-th stage of shift register, where A and A+n are the row numbers of the gate lines in the display panel, and A is an odd number, A=1, 3, . . . , and n is greater than 2.

In some embodiments, the second group of clock signal lines includes a plurality of second clock signal lines (e.g., n second clock signal lines), the second group of shift registers includes a plurality of second subgroups of shift registers, each of which includes n shift registers, the n shift registers in a same second subgroup of shift registers are coupled to n second clock signal lines in one-to-one correspondence, respectively, and an output terminal of a (A+1)-th stage of shift register is electrically coupled to an input terminal of a (A+1+n)-th stage of shift register, where A+1 and A+1+n are the row numbers of the gate lines in the display panel.

In some embodiments, a reset terminal of the A-th stage of shift register is electrically coupled to an output terminal of a (A+a+n)-th stage of shift register, and a reset terminal of the (A+1)-th stage of shift register is electrically coupled to an output terminal of a (A+a+n+1)-th stage of shift register, where a is a natural number smaller than n/2.

In some embodiments, the first group of shift registers and the second group of shift registers in the gate driving circuit may be at two opposite sides of the display panel, respectively, and may be at least partially in the peripheral area surrounding the display area of the display panel. That is to say, the shift registers for driving the odd-numbered rows of gate lines may be in the peripheral area at one side of the display panel, and the shift registers for driving the even-numbered rows of gate lines may be in the peripheral area at another side of the display panel.

In some embodiments, the gate driving circuit is a gate driver-on-array (GOA) circuit.

As described above, the stage number of the shift register is the same as the row number of the gate line coupled to the shift register in the present disclosure.

As illustrated in FIG. 3, a "first row" represents that the shift register is coupled to a first row of gate line in the display panel, and the shift register is a first stage of shift register in the gate driving circuit. A "third row" represents that the shift register is coupled to a third row of gate line in the display panel, and the shift register is a third stage of shift register in the gate driving circuit. A "fifth row" represents that the shift register is coupled to a fifth row of gate line in the display panel, and the shift register is a fifth stage of shift register in the gate driving circuit. A "seventh row" represents that the shift register is coupled to a seventh row of gate line in the display panel, and the shift register is a seventh stage of shift register in the gate driving circuit. A "ninth row" represents that the shift register is coupled to a ninth row of gate line in the display panel, and the shift register is a ninth stage of shift register in the gate driving circuit. An "eleventh row" represents that the shift register is coupled to an eleventh row of gate line in the display panel, and the shift register is an eleventh stage of shift register in the gate driving circuit. A "thirteenth row" represents that the shift register is coupled to a thirteenth row of gate line in the display panel, and the shift register is a thirteenth stage of shift register in the gate driving circuit. A "fifteenth row" represents that the shift register is coupled to a fifteenth row of gate line in the display panel, and the shift register is a fifteenth stage of shift register in the gate driving circuit, and so on.

As illustrated in FIG. 4, a "second row" represents that the shift register is coupled to a second row of gate line in the display panel, and the shift register is a second stage of shift register in the gate driving circuit. A "fourth row" represents that the shift register is coupled to a fourth row of gate line in the display panel, and the shift register is a fourth stage of shift register in the gate driving circuit. A "sixth row" represents that the shift register is coupled to a sixth row of gate line in the display panel, and the shift register is a sixth stage of shift register in the gate driving circuit. An "eighth row" represents that the shift register is coupled to an eighth row of gate line in the display panel, and the shift register is an eighth stage of shift register in the gate driving circuit. A "tenth row" represents that the shift register is coupled to a tenth row of gate line in the display panel, and the shift register is a tenth stage of shift register in the gate driving circuit. A "twelfth row" represents that the shift register is coupled to a twelfth row of gate line in the display panel, and the shift register is a twelfth stage of shift register in the gate driving circuit. A "fourteenth row" represents that the shift register is coupled to a fourteenth row of gate line in the display panel, and the shift register is a fourteenth stage of shift register in the gate driving circuit. A "sixteenth row" represents that the shift register is coupled to a sixteenth row of gate line in the display panel, and the shift register is a sixteenth stage of shift register in the gate driving circuit, and so on.

In the present disclosure, the number of the first or second subgroups of shift registers included in the first or second group of shift registers is not particularly limited. For example, the first group of shift registers including two first subgroups (one on the left and the other on the right in FIG. 3) of shift registers is illustrated in FIG. 3. The second group of shift registers including two second subgroups (one on the left and the other on the right in FIG. 4) of shift registers is illustrated in FIG. 4.

In the present disclosure, A is an odd variable while A+1 is an even variable, and n is a fixed value.

It should be understood that, for one stage of shift register, it should be ensured that a reset signal of the stage of shift register and an output signal of the stage of shift register should be staggered completely. However, the time interval between the reset signal of the stage of shift register and the output signal of the stage of shift register should not be too large. The time interval between the reset signal of the stage of shift register and the output signal of the stage of shift register will be described and explained later, which will not be described here.

When the gate driving circuit is employed to drive the display panel for display, it is required to supply clock signals and initial control signals to the gate driving circuit. The clock signals include first clock signals supplied to the first clock signal lines and second clock signals supplied to the second clock signal lines. The initial control signals include first initial control signals supplied to input terminals Input of first ones (e.g., most upstream ones) of shift registers in first subgroups of shift registers of the first group of shift registers, and second initial control signals supplied to input terminals Input of a first ones (e.g., most upstream ones) of shift registers in second subgroups of shift registers of the second group of shift registers.

In an embodiment, a plurality of first initial control signals are supplied to first ones of shift registers in first subgroups of shift registers sequentially according to sequential order of their stage numbers; a plurality of second initial control signals are supplied to first ones of shift registers in second subgroups of shift registers sequentially according to sequential order of their stage numbers; the first clock signals are supplied to the shift registers in the first group of shift registers sequentially according to sequential order of their stage numbers; and the second clock signals are supplied to the shift registers in the second group of shift registers sequentially according to sequential order of their stage numbers.

In the gate driving circuit according to the present disclosure, output signals from the A-th stage of shift register and the (A+n)-th stage of shift register are just staggered. That is, the falling edge of the output signal from the A-th stage of shift register overlaps the rising edge of the output signal from the (A+n)-th stage of shift register.

For resetting the A-th stage of shift register and avoiding overlapping of the falling edge of the output signal and the rising edge of the reset signal, in the present disclosure, the output signal from the (A+n+a)-th stage of shift register is employed to reset the A-th stage of shift register. Thus, a reset signal for a stage of shift register is delayed from an output signal of the stage of shift register by a$\Delta t$, where $\Delta t$ is a time interval between clock signals for two adjacent stages of shift registers. Therefore, the outputting defect due to coupling between the reset signal and the output signal will not occur in the reset phase. Further, since a<n/2, the reset signal is delayed from the output signal by a time interval smaller than T, where T is a duration in which the first clock signal is of a first level in one cycle. Because the time interval is relatively small, the output of the shift register will not be largely affected.

Similarly, for resetting the (A+1)-th stage of shift register, the output signal from the (A+n+a+1)-th stage of shift register is employed to reset the (A+1)-th stage of shift register. A reset signal for a stage of shift register is delayed from an output signal of the stage of shift register by a$\Delta t$. Therefore, the outputting defect due to coupling between the reset signal and the output signal will not occur in the reset phase. Further, since a<n/2, the reset signal is delayed from the output signal by a time interval smaller than T. Because the time interval is relatively small, the output of the shift register will not be largely affected.

In the present disclosure, the specific value of n is not particularly limited, as long as n is an even number larger than 2. In the embodiments as illustrated in FIGS. 3 and 4, n=4. It should be noted that although eight stages of shift registers in two columns are illustrated in FIG. 3, the shift registers for providing scanning signals for the odd-numbered rows of gate lines are arranged in one column in the actual display apparatus. Similarly, although eight stages of shift registers in two columns are illustrated in FIG. 4, the shift registers for providing scanning signals for the even-numbered rows of gate lines are arranged in one column in the actual display apparatus.

As described above, n is equal to 4 in the embodiments as illustrated in FIGS. 3 and 4, the first group of clock signal lines includes a first clock signal line CLK1, a first clock signal line CLK3, a first clock signal line CLK5 and a first clock signal line CLK7, and the second group of clock signal lines includes a second clock signal line CLK2, a second clock signal line CLK4, a second clock signal line CLK6 and a second clock signal line CLK8.

As illustrated in FIG. 3, every four shift registers constitute one subgroup of shift registers. FIG. 3 illustrates two subgroups of shift registers. The first clock signal line CLK1 is coupled to the first and ninth stages of shift registers, the first clock signal line CLK3 is coupled to the third and eleventh stages of shift registers, the first clock signal line CLK5 is coupled to the fifth and thirteenth stages of shift registers, and the first clock signal line CLK7 is coupled to the seventh and fifteenth stages of shift registers. Moreover, from FIG. 3 it can be seen that, an initial signal STV1 is employed to provide an input signal for the first stage of shift register, and an initial signal STV3 is employed to provide an input signal for the third stage of shift register.

As illustrated in FIG. 4, the second clock signal line CLK2 is coupled to the second and tenth stages of shift registers, the second clock signal line CLK4 is coupled to the fourth and twelfth stages of shift registers, the second clock signal line CLK6 is coupled to the sixth and fourteenth stages of shift registers, and the second clock signal line CLK8 is coupled to the eighth and sixteenth stages of shift registers. Moreover, from FIG. 4 it can be seen that, an initial signal STV2 is employed to provide an input signal for the second stage of shift register, and an initial signal STV4 is employed to provide an input signal for the fourth stage of shift register.

Figure 5:
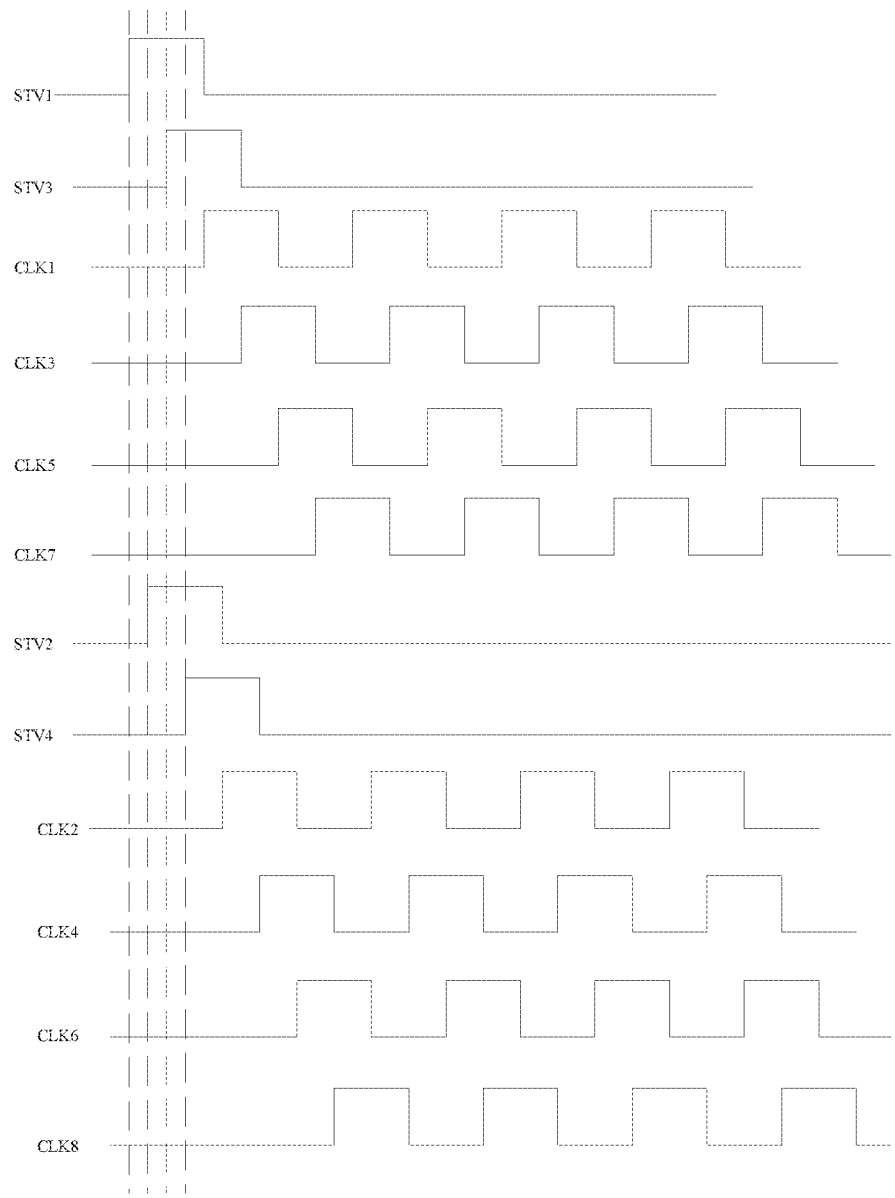
FIG. 5 is a diagram illustrating timing sequences of first clock signals and second clock signals according to an embodiment of the present disclosure.

As illustrated in FIG. 5, during the operation of the gate driving circuit, the first initial control signal STV1, the second initial control signal STV2, the first initial control signal STV3 and the second initial control signal STV4, which are successively delayed by T/4, are provided.

The first clock signal supplied from the first clock signal line CLK3 is delayed from the first clock signal supplied from the first clock signal line CLK1 by a time interval $\Delta t_1$, and the time interval $\Delta t_1$ satisfies $\Delta t_1=2T/n$, where T is a duration in which a first clock signal is of a first level in one cycle of the first clock signal. The second clock signal supplied from the second clock signal line CLK2 is delayed from the first clock signal supplied from the first clock signal line CLK1 by a time interval $\Delta t_2=T/n$, and so on.

A time interval $\Delta t_3$ between the first initial control signal STV1 and the second initial control signal STV2 is T/n, and a time interval $\Delta t_4$ between the first initial control signal STV1 and the first initial control signal STV3 is 2T/n, and so on.

In the present disclosure, as illustrated in FIGS. 3 to 5, a time interval $\Delta t_1$ exists between two adjacent first clock signals, and a time interval $\Delta t_2$ exists between output signals from two adjacent stages of shift registers. A time interval $\Delta t_2$ exists between the signal output from the (A+1+n)-th stage of shift register and the signal output from the (A+n)-th stage of shift register. Since a time interval exists between the output signal from the (A+n)-th stage of shift register and the reset signal for the (A+n)-th stage of shift register, disturbed output due to the capacitive coupling caused by the overlapping in time of the falling edge of the output signal and the rising edge of the reset signal can be avoided. Accordingly, by employing the gate driving circuit provided by the present disclosure to drive a display panel, the duty cycle of the clock signal can be increased, so that the time for charging the pixel units can be prolonged and the display performance of the display panel can be improved.

In the embodiments as illustrated in FIGS. 3 and 4, n is equal to 4. That is to say, each group of clock signal lines includes four clock signal lines. Accordingly, as illustrated in FIG. 5, a time interval $\Delta t_1$ between two adjacent first clock signal lines is T/2. In some embodiments, a=1.

In the embodiments as illustrated in FIGS. 3 and 4, the numbers in the circles represent the stage numbers of the shift registers supplying the reset signals.

In the embodiments as illustrated in FIG. 3, the output signal from the sixth stage of shift register is employed to reset the first stage of shift register, the output signal from the eighth stage of shift register is employed to reset the third stage of shift register, the output signal from the tenth stage of shift register is employed to reset the fifth stage of shift register, the output signal from the twelfth stage of shift register is employed to reset the seventh stage of shift register, the output signal from the fourteenth stage of shift register is employed to reset the ninth stage of shift register, the output signal from the sixteenth stage of shift register is employed to reset the eleventh stage of shift register, the output signal from the eighteenth stage of shift register is employed to reset the thirteenth stage of shift register, and the output signal from the twentieth stage of shift register is employed to reset the fifteenth stage of shift register.

In the embodiments as illustrated in FIG. 4, the output signal from the seventh stage of shift register is employed to reset the second stage of shift register, the output signal from the ninth stage of shift register is employed to reset the fourth stage of shift register, the output signal from the eleventh stage of shift register is employed to reset the sixth stage of shift register, the output signal from the thirteenth stage of shift register is employed to reset the eighth stage of shift register, the output signal from the fifteenth stage of shift register is employed to reset the tenth stage of shift register, the output signal from the seventeenth stage of shift register is employed to reset the twelfth stage of shift register, the output signal from the nineteenth stage of shift register is employed to reset the fourteenth stage of shift register, and the output signal from the twenty-first stage of shift register is employed to reset the sixteenth stage of shift register.

By employing the gate driving circuit provided by the present disclosure to drive the display panel to display, the first clock signal has a duty cycle in a range from 42% to 50%, and the second clock signal has a duty cycle in a range from 42% to 50%, thereby effectively prolonging the time for charging the pixel unit and improving the display performance.

In the present disclosure, the specific structure of the shift register is not particularly limited. In some embodiments, as illustrated in FIG. 6, the shift register may include an input sub-circuit 110, a pull-up sub-circuit 120, a pull-down sub-circuit 130, a pull-down control sub-circuit 140 and a reset sub-circuit 150.

Figure 6:
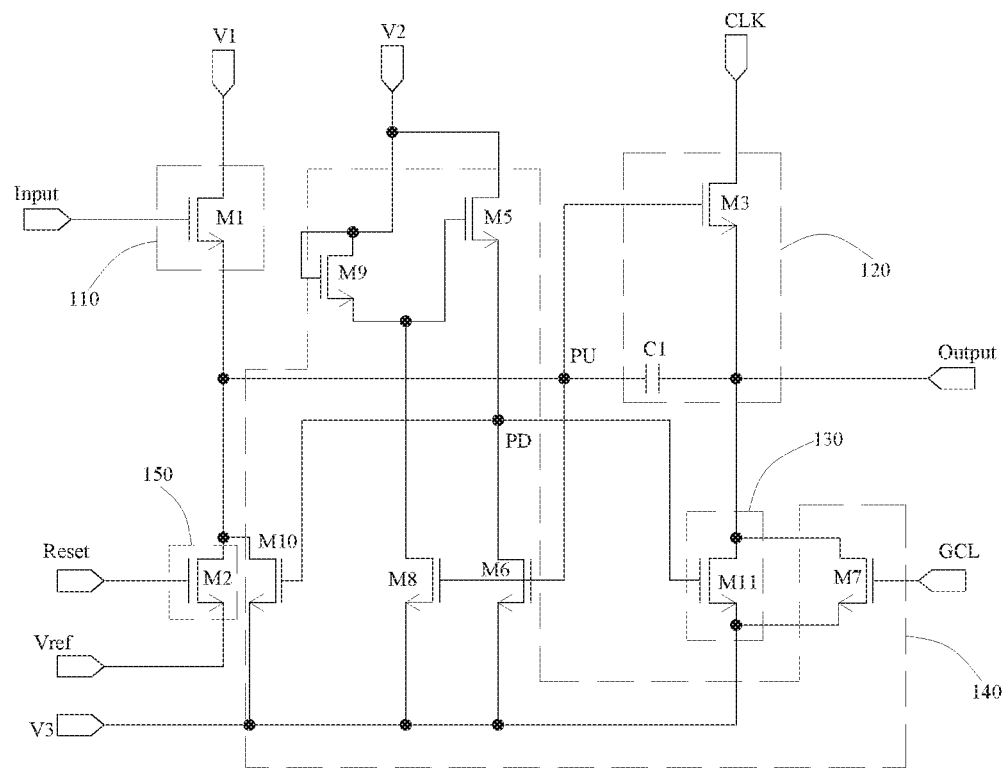
FIG. 6 is a circuit diagram illustrating a shift register in a gate driving circuit according to an embodiment of the present disclosure.

As illustrated in FIG. 6, the input sub-circuit 110 has a control terminal coupled to an input terminal Input of the shift register, an input terminal coupled to a first level signal terminal V1, and an output terminal coupled to a control terminal PU of the pull-up sub-circuit 120. The input terminal and the output terminal of the input sub-circuit 110 are electrically connected when a first level signal is received at the control terminal of the input sub-circuit 110.

The pull-up sub-circuit 120 has an input terminal coupled to a corresponding clock signal line through a clock signal terminal CLK, and an output terminal coupled to an output terminal Output of the shift register. The input terminal and the output terminal of the pull-up sub-circuit 120 are electrically connected when a first level signal is received at the control terminal PU of the pull-up sub-circuit 120.

The pull-down control sub-circuit 140 has a first input terminal coupled to a second level signal terminal V2, and a second input terminal coupled to a third level signal terminal V3, and an absolute value of a voltage of a second level signal provided by the second level signal terminal V2 is larger than an absolute value of a voltage of a first level signal provided by the first level signal terminal V1. A polarity of the second level signal is the same as a polarity of the first level signal. A polarity of a third level signal provided by the third level signal terminal V3 is opposite to the polarity of the second level signal provided by the second level signal terminal V2 (i.e., one has a positive polarity and the other has a negative polarity). A control terminal of the pull-down control sub-circuit 140 is coupled to the control terminal PU of the pull-up sub-circuit 120, a first output terminal of the pull-down control sub-circuit 140 is coupled to a control terminal PD of the pull-down sub-circuit 130, and a second output terminal of the pull-down control sub-circuit 140 is coupled to the control terminal PU of the pull-up sub-circuit 120. The second input terminal and the first output terminal of the pull-down control sub-circuit 140 are electrically connected when a first level signal is received at the control terminal of the pull-down control sub-circuit 140.

The pull-down sub-circuit 130 has an input terminal coupled to the third level signal terminal V3, and an output terminal coupled to the output terminal Output of the shift register. The input terminal and the output terminal of the pull-down sub-circuit 130 are electrically connected when a first level signal is received at the control terminal PD of the pull-down sub-circuit 130. The input terminal and the output terminal of the pull-down sub-circuit 130 are electrically disconnected when a second level signal is received at the control terminal of the pull-down sub-circuit 130.

The reset sub-circuit 150 has a control terminal coupled to a reset terminal Reset of the shift register, an input terminal coupled to the third level signal terminal V3, and an output terminal coupled to the control terminal PU of the pull-up sub-circuit 120. The input terminal and the output terminal of the reset sub-circuit 150 are electrically connected when a first level signal is received at the control terminal of the reset sub-circuit 150, such that a potential at the control terminal PU of the pull-up sub-circuit 120 is pulled down to that of the third level signal provided by the third level signal terminal V3.

In the present disclosure, polarities of the first, second and third level signals depend on the thin film transistors of the pixel units in the display panel. For example, in a case where the thin film transistors in the pixel units are N-type transistors, the first and second level signals are high level signals (i.e., positive voltages) and the third level signal is a low level signal (i.e., a negative voltage). On the other hand, in a case where the thin film transistors in the pixel units are P-type transistors, the first and second level signals are low level signals (i.e., negative voltages) and the third level signal is a high level signal (i.e., a positive voltage).

The operating cycle of the shift register may include an input phase, an output phase and a pull-down phase. As described above, the shift registers are cascaded in the gate driving circuit. As such, for a stage of shift register, a first control signal received at a control terminal of the input sub-circuit 110 of the stage of shift register is actually an output signal from a shift register before and cascaded with the stage of shift register.

In the input phase, the input terminal and the output terminal of the input sub-circuit 110 are electrically connected, so the control terminal PU of the pull-up sub-circuit 120 is charged. In the input phase, the clock signal input from the clock signal line is a second level signal. Therefore, the output of the shift register is a second level signal, even if the input terminal and the output terminal of the pull-up sub-circuit 120 are electrically connected. In this phase, since a first level signal exists at the control terminal of the pull-up sub-circuit 120, a second level signal is output from the pull-down control sub-circuit 140 to the control terminal PD of the pull-down sub-circuit 130, so that the input terminal and the output terminal of the pull-down sub-circuit 130 are electrically disconnected.

In the output phase, the clock signal supplied from the clock signal line is of a first level. Since the input terminal and the output terminal of the input sub-circuit 110 are electrically disconnected, the control terminal PU of the pull-up sub-circuit 120 is floating, and the control terminal PU of the pull-up sub-circuit 120 is coupled to a voltage having a higher absolute value due to the bootstrapping effect, such that the electrically connected state of the input terminal and the output terminal of the pull-up sub-circuit 120 is maintained. In the output phase, the clock signal line supplies the clock signal of a first level to ensure that the output terminal Output of the shift register outputs a first level signal.

In the pull-down phase, a first level signal is provided to the control terminal of the reset sub-circuit 150 through the reset terminal Reset. As such, the potential at the control terminal of the pull-up sub-circuit 120 is pulled down to a third level by the reset sub-circuit 150, and the pull-down control sub-circuit 140 supplies a second level signal to the control terminal PD of the pull-down sub-circuit 130, such that the input terminal and the output terminal of the pull-down sub-circuit 130 are electrically connected, and the output terminal Output of the shift register and the third level signal terminal are electrically connected to pull down a potential at the output terminal of the shift register to stop outputting.

In the embodiment as illustrated in FIG. 6, the pull-up sub-circuit 120 includes a pull-up transistor M3 and a storage capacitor C1. The pull-up transistor M3 has a gate electrode coupled to the control terminal PU of the pull-up sub-circuit 120, a first electrode coupled to the input terminal of the pull-up sub-circuit 120 (i.e., the first electrode of the pull-up transistor M3 is coupled to the clock signal line), and a second electrode coupled to the output terminal of the pull-up sub-circuit 120 (i.e., the second electrode of the pull-up transistor M3 is coupled to the output terminal Output of the shift register). The pull-up transistor M3 is configured such that the first electrode and the second electrode of the pull-up transistor M3 are electrically connected when a first level signal is received at the gate electrode of the pull-up transistor M3.

A first terminal of the storage capacitor C1 is coupled to the gate electrode of the pull-up transistor M3, and a second terminal of the storage capacitor C1 is coupled to the second electrode of the pull-up transistor M3.

When a first level signal is received at the gate electrode of the pull-up transistor M3, the storage capacitor C1 is charged while the first electrode and the second electrode of the pull-up transistor M3 are electrically connected. When the gate electrode of the pull-up transistor M3 is floating, the gate electrode of the pull-up transistor M3 is coupled to a higher voltage due to the bootstrapping effect of the storage capacitor C1, such that the ON state of the pull-up transistor M3 is maintained.

In the embodiment as illustrated in FIG. 6, the pull-down sub-circuit 130 includes a pull-down transistor M11 having a gate electrode coupled to the control terminal of the pull-down sub-circuit 130, a first electrode coupled to the input terminal of the pull-down sub-circuit 130 (i.e., the first electrode of the pull-down transistor M11 is coupled to the third level signal V3), and a second electrode coupled to the output terminal of the pull-down sub-circuit 130 (i.e., the second electrode of the pull-down transistor M11 is coupled to the output terminal Output of the shift register). The pull-down transistor M11 is configured such that the first electrode and the second electrode of the pull-down transistor M11 are electrically connected when a first level signal is received at the gate electrode of the pull-down transistor M11.

In the embodiment as illustrated in FIG. 6, the pull-down control sub-circuit 140 includes a plurality of pull-down control transistors including a first pull-down control transistor M9, a second pull-down control transistor M5, a third pull-down control transistor M6, a fourth pull-down control transistor M8, a fifth pull-down control transistor M10 and a sixth pull-down control transistor M7.

The first pull-down control transistor M9 has a gate electrode and a first electrode both coupled to the second level signal terminal V2, and a second electrode coupled to a gate electrode of the second pull-down control transistor M5.

The second pull-down control transistor M5 has a first electrode coupled to the second level signal terminal V2 and a second electrode coupled to the first output terminal of the pull-down control sub-circuit 140.

The third pull-down control transistor M6 has a gate electrode coupled to the control terminal PU of the pull-up sub-circuit 120, a first electrode coupled to the third level signal terminal V3 and a second electrode coupled to the first output terminal of the pull-down control sub-circuit 140.

The fourth pull-down control transistor M8 has a gate electrode coupled to the gate electrode of the third pull-down control transistor M6, a first electrode coupled to the third level signal terminal V3 and a second electrode coupled to the second electrode of the first pull-down control transistor M9.

The fifth pull-down control transistor M10 has a gate electrode coupled to the first output terminal of the pull-down control sub-circuit 140, a first electrode coupled to the third level signal terminal V3 and a second electrode coupled to the second output terminal of the pull-down control sub-circuit 140.

The sixth pull-down control transistor M7 has a gate electrode coupled to a control signal terminal GCL, a first electrode coupled to the third level signal terminal V3 and a second electrode coupled to the output terminal Output of the shift register.

In the present disclosure, for any one of the pull-down control transistors, the first electrode and the second electrode of the pull-down control transistor are electrically connected when a first level signal is received at the gate electrode of the pull-down control transistor.

In the embodiment as illustrated in FIG. 6, the reset sub-circuit 150 includes a reset transistor M2 having a gate electrode coupled to the control terminal of the reset sub-circuit 150 (i.e., the gate electrode of the reset transistor M2 is coupled to the reset terminal Reset), a first electrode coupled to a reference signal terminal Vref and a second electrode coupled to the control terminal PU of the pull-up sub-circuit 120. The first electrode and the second electrode of the reset transistor M2 are electrically connected when a first level signal is received at the gate electrode of the reset transistor M2.

In the embodiment as illustrated in FIG. 6, the input sub-circuit 110 includes an input transistor M1 having a gate electrode coupled to the control terminal of the input sub-circuit 110 (i.e., the gate electrode of the input transistor M1 is coupled to the input terminal Input of the shift register), a first electrode coupled to the input terminal of the input sub-circuit 110 (i.e., the first electrode of the input transistor M1 is coupled to the first level signal terminal V1) and a second electrode coupled to the control terminal PU of the pull-up sub-circuit 120. The input transistor M1 is configured such that the first electrode and the second electrode of the input transistor M1 are electrically connected when a first level signal is received at the gate electrode of the input transistor M1.

In the present disclosure, a reference voltage provided from the reference signal terminal may be a voltage having a third level. The shift register provided by the present disclosure is suitable for bi-directional scanning.

As described above, when the gate driving circuit provided by the present disclosure is employed to provide scanning signals to the display panel, coupling between the reset signal and the output signal will not occur for any stage of shift register, so the duty cycle of the clock signal can be relatively large while ensuring normal output. Since the clock signal has a relatively large duty cycle, the pixel units can be sufficiently charged by the gate driving circuit to improve the display stability of the display apparatus.

As another aspect of the present disclosure, there is provided a display apparatus including a display panel and a gate driving circuit, the display panel includes a plurality of gate lines, the gate driving circuit is any of the above gate driving circuits provided by the present disclosure, and the output terminals of the plurality of shift registers of the gate driving circuit are coupled to the plurality of gate lines in one-to-one correspondence.

Figure 12:
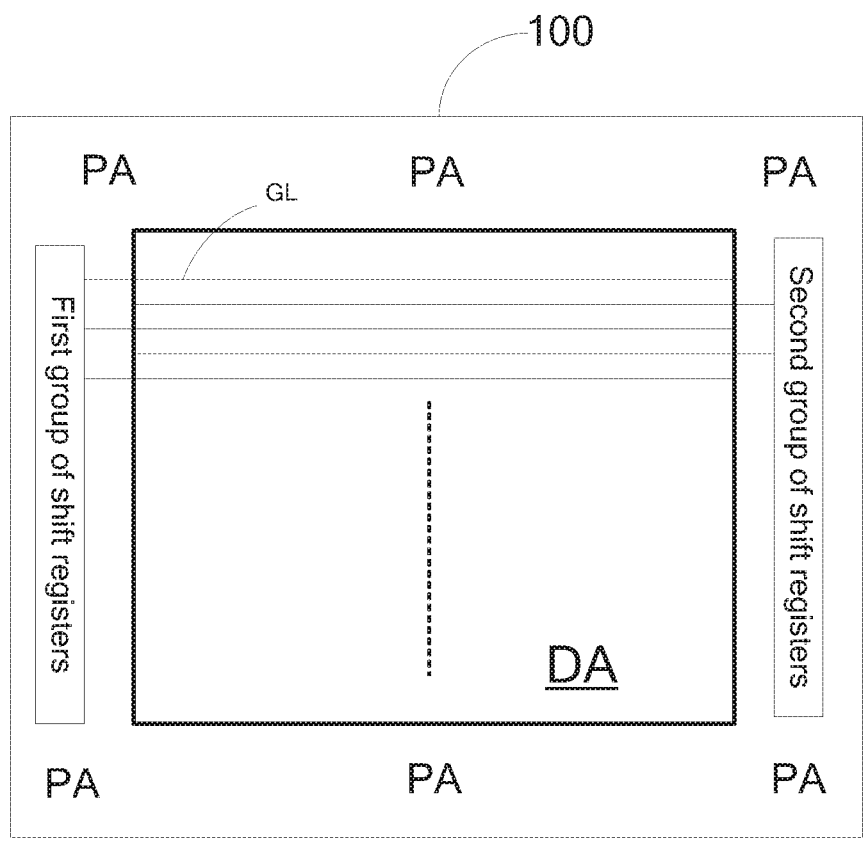
FIG. 12 is a diagram illustrating a display apparatus according to an embodiment of the present disclosure.

FIG. 12 is a diagram illustrating a display apparatus according to an embodiment of the present disclosure. As illustrated in FIG. 12, the display apparatus in some embodiments includes a display panel 100 and a gate driving circuit. The gate driving circuit includes a first group of shift registers and a second group of shift registers, which are provided in a peripheral area PA surrounding a display area DA of the display panel 100 and at two opposite sides of the display area DA, respectively. The display panel includes a plurality of gate lines GL sequentially arranged, and the output terminals of the plurality of shift registers of the gate driving circuit are coupled to the plurality of gate lines in one-to-one correspondence.

As described above, by employing the gate driving circuit, the clock signal is allowed to have a relatively large duty cycle, such that the pixel unit can be sufficiently charged to improve the display stability of the display apparatus.

As another aspect of the present disclosure, there is provided a method of driving the display apparatus. The clock signals include first clock signals supplied from the first clock signal lines and second clock signals supplied from the second clock signal lines. The method includes: supplying a plurality of first initial control signals to the first shift registers in first subgroups of shift registers sequentially according to sequential order of their stage numbers; supplying a plurality of second initial control signals to the first shift registers in second subgroups of shift registers sequentially according to sequential order of their stage numbers; supplying the first clock signals to the shift registers in the first group of shift registers sequentially according to sequential order of their stage numbers; and supplying the second clock signals to the shift registers in the second group of shift registers sequentially according to sequential order of their stage numbers.

In some embodiments, for the clock signals input to two adjacent stages of shift registers, the clock signal for the next stage of shift register is delayed from the clock signal for the current stage of shift register by T/n; the first input second initial control signal is delayed from the first input first initial control signal by T/n, a time interval between two first initial control signals adjacent in time is 2T/n, and a time interval between two second initial control signals adjacent in time is 2T/n. T is a duration in which a clock signal is of a first level in one cycle.

In some embodiments, the first clock signal has a duty cycle in a range from 42% to 50%, and the second clock signal has a duty cycle in a range from 42% to 50%.

The operating principle and beneficial effect of the method have been described in detail above with reference to the gate driving circuit, which will not repeated here.

Figure 7:
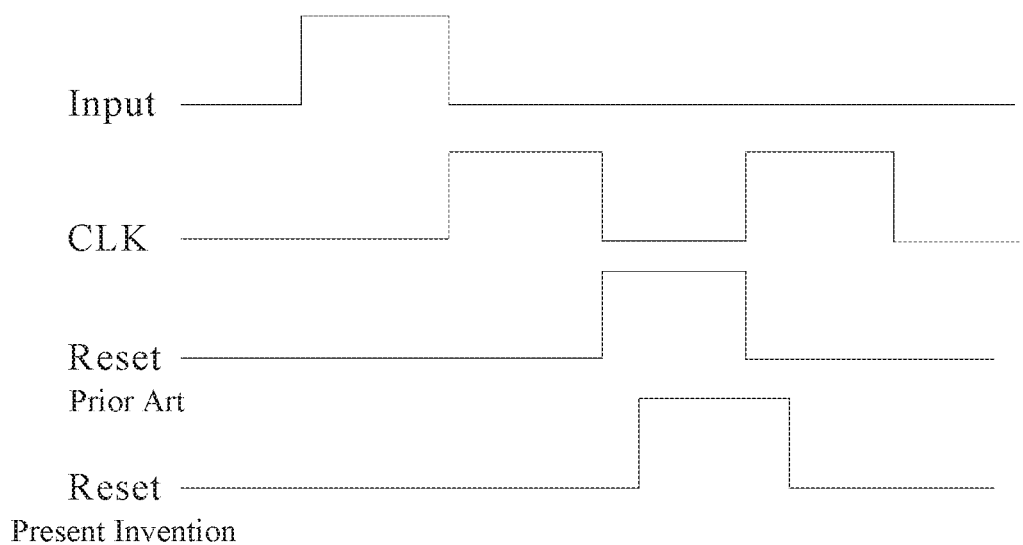
FIG. 7 is a diagram illustrating a comparison between a timing sequence for a gate driving circuit according to an embodiment of the present disclosure and a timing sequence for a gate driving circuit in a comparison example.

FIG. 7 is a diagram illustrating a comparison between a timing sequence of a gate driving circuit according to an embodiment of the present disclosure and a timing sequence of a gate driving circuit in a comparison example.

Here, the gate driving circuit according to embodiments of the present disclosure includes a first group of clock signal lines and a second group of clock signal lines. The first group of clock signal lines includes four first clock signal lines, namely, a first clock signal line CLK1, a first clock signal line CLK3, a first clock signal line CLK5 and a first clock signal line CLK7. The second group of clock signal lines includes four second clock signal lines, namely, a second clock signal line CLK2, a second clock signal line CLK4, a second clock signal line CLK6 and a second clock signal line CLK8. As illustrated in FIGS. 3 and 4, the shift registers in the first group of shift registers are cascaded in a manner as follows: the output terminal of the A-th stage of shift register is electrically coupled to the input terminal of the (A+4)-th stage of shift register, where A is the row number of a corresponding gate line of the shift register, A is an odd number, A=1, 3 . . . ; the reset terminal of the A-th stage of shift register is electrically coupled to the output terminal of the (A+5)-th stage of shift register. The shift registers in the second group of shift registers are cascaded in a manner as follows: the output terminal of the (A+1)-th stage of shift register is electrically coupled to the input terminal of the (A+5)-th stage of shift register, and the reset terminal of the (A+1)-th stage of shift register is electrically coupled to the output terminal of the (A+6)-th stage of shift register. Time sequences of first and second clock signals may refer to FIG. 5.

The gate driving circuit in the comparison example is different from that in the embodiment of the present disclosure in that: the reset terminal of the A-th stage of shift register is coupled to the output terminal of the (A+4)-th stage of shift register, and the reset terminal of the (A+1)-th stage of shift register is coupled to the output terminal of the (A+5)-th stage of shift register, as illustrated in FIGS. 1 and 2, for example.

Taking the fifth stage of shift register coupled to the fifth row of gate line as an example, the reset terminal of the fifth stage of shift register receives the reset signal from the ninth stage of shift register in the gate driving circuit as illustrated in FIGS. 1 and 2, while the reset terminal of the fifth stage of shift register receives the reset signal from the tenth stage of shift register in the gate driving circuit according to the embodiments of the present disclosure as illustrated in FIGS. 3 and 4. According to experiments, the reset signal of the shift register in the present disclosure is delayed from that in the comparison example by T/4, such that the shift register can output normally in a case where the duty cycle of the clock signal is set to be larger.

Figure 8:
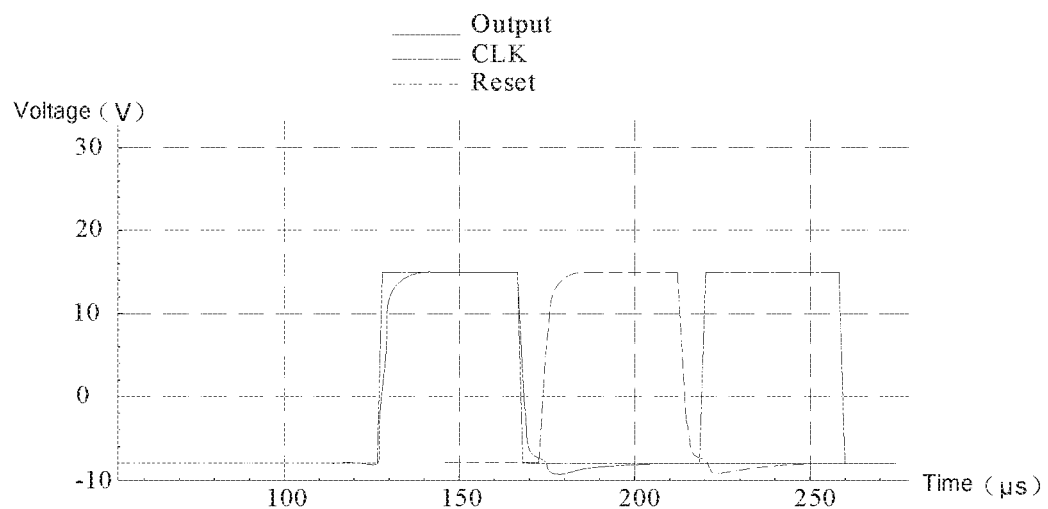
FIG. 8 illustrates simulated results of an output signal, a reset signal and a clock signal for a stage of shift register in a gate driving circuit in a comparison example, in which a duty cycle of the clock signal is 42%.

FIG. 8 illustrates simulated results of an output signal, a reset signal and a clock signal for a stage of shift register in a gate driving circuit in a comparison example, in which a duty cycle of the clock signal is 42%.

As illustrated in FIG. 8, a time interval exists between the output signal from the output terminal Output and a reset signal received at the reset terminal Reset, and the shift register has no output in the reset phase.

Figure 9:
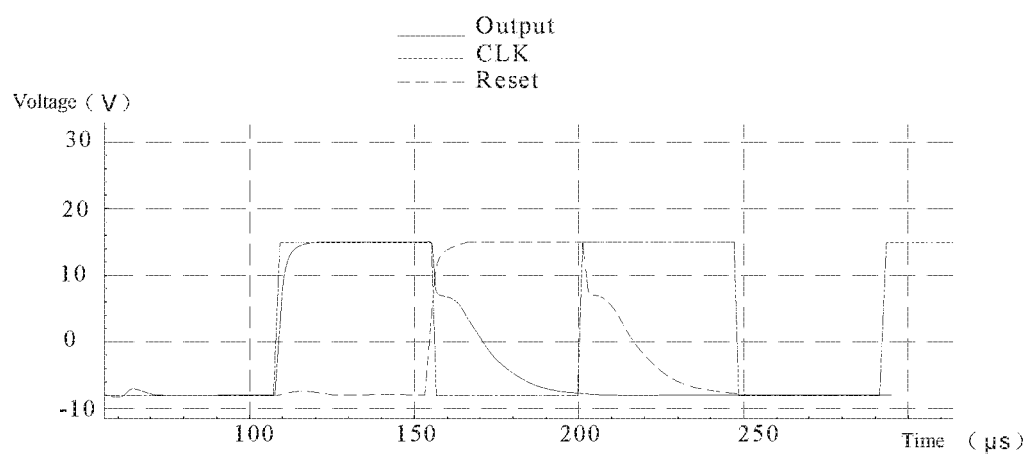
FIG. 9 illustrates simulated results of an output signal, a reset signal and a clock signal for a stage of shift register in a gate driving circuit in a comparison example, in which a duty cycle of the clock signal is 50%.

FIG. 9 illustrates output waveforms of a stage of shift register in a gate driving circuit provided by a comparison example, in which a duty cycle of the clock signal is 50%. As illustrated in FIG. 9, the falling edge of the output signal from the output terminal Output overlaps the rising edge of the reset signal received at the reset terminal Reset. The potential at the output terminal of the shift register is not effectively pulled down in the reset phase due to the influence of the reset signal, resulting in an output error.

Figure 10:
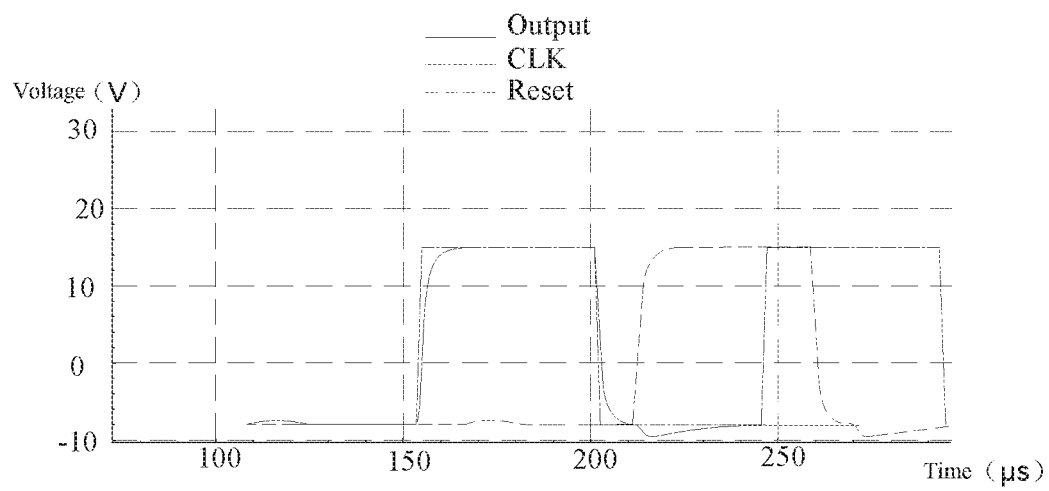
FIG. 10 illustrates simulated results of an output signal, a reset signal and a clock signal for a stage of shift register in a gate driving circuit according to an embodiment of the present disclosure, in which a duty cycle of the clock signal is 50%.

FIG. 10 illustrates output waveforms of a stage of shift register in a gate driving circuit provided by an embodiment of the present disclosure, in which a duty cycle of the clock signal is 50%. From FIG. 10 it can be seen that a time interval exists between the rising edge of the reset signal received at the reset terminal Reset and the falling edge of the output signal from the output terminal Output. As such, the reset signal will not affect the potential at the output terminal, so that a normal output can be ensured.

Figure 11:
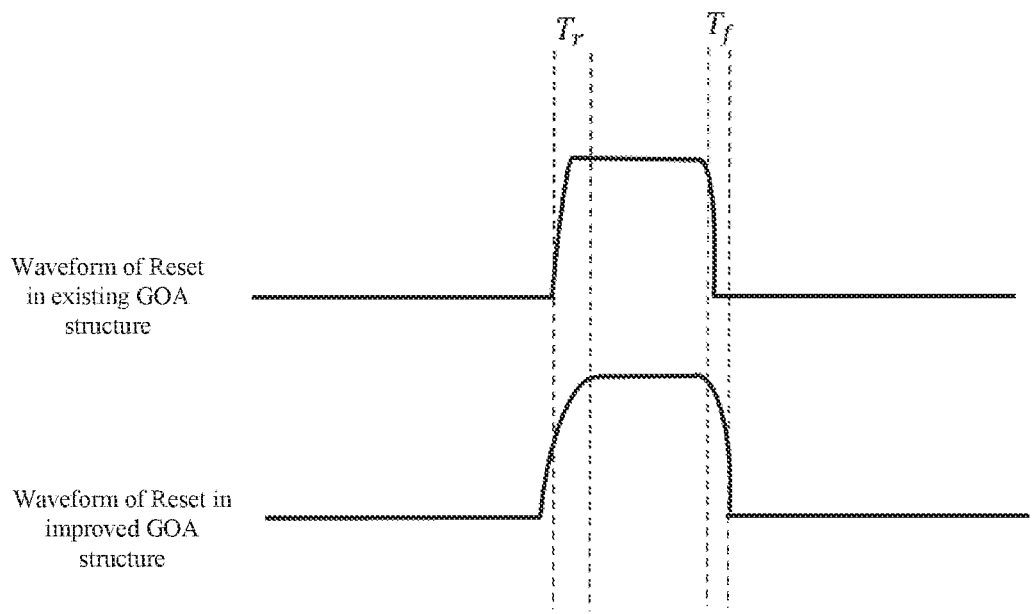
FIG. 11 is a diagram illustrating a comparison between a waveform of a reset signal in a comparison example and a waveform of a reset signal according to an embodiment of the present disclosure.

FIG. 11 is a diagram illustrating a waveform of a reset signal used in a comparison example and a waveform of a reset signal used in the gate driving circuit according to an embodiment of the present disclosure.

In a gate driving circuit, the influence of the reset signal on the voltage at the output terminal of the shift register can be represented as below:

$$\Delta V_p = \Delta V_d \times \frac{C_c}{\Sigma C}$$

where $\Delta V_p$ is a magnitude of a voltage jump in a unit time at the output terminal of the shift register; $\Delta V_d$ is a magnitude of a voltage jump in a unit time of the reset signal; $C_c$ is the coupling capacitance of the output terminal of the shift register and the reset signal; and $\Sigma C$ is a sum of the coupling capacitances of the output terminal of the shift register and all signals.

As illustrated in FIG. 11, the rising time Tr of the reset signal according to the embodiment of the present disclosure is larger than the rising time Tr of the reset signal in the comparison example, and the falling time Tf of the reset signal according to the embodiment of the present disclosure is larger than the falling time Tf of the reset signal in the comparison example, that is, the magnitude $\Delta V_d$ of the voltage jump in a unit time of the reset signal is smaller according to the present application. As such, the magnitude $\Delta V_p$ of the voltage jump in a unit time at the output terminal of the shift register is also smaller according to the embodiment of the present disclosure. Therefore, the output of the shift register according to the embodiment of the present disclosure is more stable.

It is to be understood that the above embodiments are merely exemplary embodiments for the purpose of explaining the principles of the present disclosure, but the present disclosure is not limited thereto. Various modifications and improvements can be made by those skilled in the art without departing from the spirit and scope of the present disclosure. These modifications and improvements are also considered to be within the protection scope of the present disclosure.

What is claimed is:

1. A gate driving circuit for a display panel, the display panel comprising a plurality of rows of gate lines sequentially arranged, the gate driving circuit comprising a plurality of shift registers, the plurality of shift registers comprising a first group of shift registers and a second group of shift registers, the first group of shift registers being configured to provide scanning signals for odd-numbered rows of gate lines of the plurality of rows of gate lines in the display panel, and the second group of shift registers being configured to provide scanning signals for even-numbered rows of gate lines of the plurality of rows of gate lines in the display panel, wherein the first group of shift registers comprises a plurality of first subgroups of shift registers, each of which comprises n shift registers, an output terminal of an A-th stage of shift register electrically coupled to an A-th row of gate line is electrically coupled to an input terminal of a (A+n)-th stage of shift register electrically coupled to a (A+n)-th row of gate line, where A is an odd number equal to or larger than 1, and n is a natural number larger than 2;

the second group of shift registers comprises a plurality of second subgroups of shift registers, each of which comprises n shift registers, an output terminal of a (A+1)-th stage of shift register electrically coupled to a (A+1)-th row of gate line is electrically coupled to an input terminal of a (A+1+n)-th stage of shift register electrically coupled to a (A+1+n)-th row of gate line, wherein the n shift registers in each of the plurality of second subgroups of shift registers are different from the n shift registers comprised in each of the plurality of first subgroups of shift registers; and a reset terminal of the A-th stage of shift register is electrically coupled to an output terminal of a (A+a+n)-th stage of shift register electrically coupled to a (A+a+n)-th row of gate line, and a reset terminal of the (A+1)-th stage of shift register is electrically coupled to an output terminal of a (A+a+n+1)-th stage of shift register electrically coupled to a (A+a+n+1)-th row of gate line, where a is a natural number smaller than n/2.

2. The gate driving circuit of claim 1, where n is an even number greater than 2.

3. The gate driving circuit of claim 2, wherein n is equal to 4.

4. The gate driving circuit according to claim 1, wherein a is equal to 1.

5. The gate driving circuit of claim 1, wherein the display panel comprises a display area and a peripheral area surrounding the display area, and the first group of shift registers and the second group of shift registers are at two opposite sides of the display panel, respectively, and are in the peripheral area.

6. The gate driving circuit of claim 1, wherein the shift register comprises an input sub-circuit, a pull-up sub-circuit, a pull-down sub-circuit, a pull-down control sub-circuit and a reset sub-circuit;

the input sub-circuit has a control terminal coupled to an input terminal of the shift register, an input terminal coupled to a first level signal terminal, and an output terminal coupled to a control terminal of the pull-up sub-circuit, and the input sub-circuit is configured such that the input terminal and the output terminal of the input sub-circuit are electrically connected in response to a first level signal being received at the control terminal of the input sub-circuit;

the pull-up sub-circuit has an input terminal coupled to a clock signal line, and an output terminal coupled to an output terminal of the shift register, and the pull-up sub-circuit is configured such that the input terminal and the output terminal of the pull-up sub-circuit are electrically connected in response to the first level signal being received at the control terminal of the pull-up sub-circuit;

the pull-down control sub-circuit has a first input terminal coupled to a second level signal terminal, a second input terminal coupled to a third level signal terminal, a control terminal coupled to the control terminal of the pull-up sub-circuit, a first output terminal coupled to a control terminal of the pull-down sub-circuit, and a second output terminal coupled to the control terminal of the pull-up sub-circuit, and the pull-down control sub-circuit is configured such that the second input terminal and the first output terminal of the pull-down control sub-circuit are electrically connected in response to the first level signal being received at the control terminal of the pull-down control sub-circuit, an absolute value of a voltage of a second level signal provided by the second level signal terminal being larger than an absolute value of a voltage of the first level signal provided by the first level signal terminal, a polarity of the second level signal being the same as a polarity of the first level signal, and a polarity of a third level signal provided by the third level signal terminal being opposite to the polarity of the second level signal provided by the second level signal terminal;

the pull-down sub-circuit has an input terminal coupled to the third level signal terminal, and an output terminal coupled to the output terminal of the shift register, and the pull-down sub-circuit is configured such that the input terminal and the output terminal of the pull-down sub-circuit are electrically connected in response to the first level signal being received at the control terminal of the pull-down sub-circuit; and the reset sub-circuit has a control terminal coupled to a reset terminal of the shift register, an input terminal coupled to the third level signal terminal, and an output terminal coupled to the control terminal of the pull-up sub-circuit, and the reset sub-circuit is configured such that the input terminal and the output terminal of the reset sub-circuit are electrically connected in response to the first level signal being received at the control terminal of the reset sub-circuit.

7. The gate driving circuit of claim 6, wherein the pull-up sub-circuit comprises a pull-up transistor and a storage capacitor;

the pull-up transistor has a gate electrode coupled to the control terminal of the pull-up sub-circuit, a first electrode coupled to the input terminal of the pull-up sub-circuit, and a second electrode coupled to the output terminal of the pull-up sub-circuit, and the pull-up transistor is configured such that the first electrode and the second electrode of the pull-up transistor are electrically connected in response to the first level signal being received at the gate electrode of the pull-up transistor; and the storage capacitor has a first terminal coupled to the gate electrode of the pull-up transistor, and a second terminal coupled to the second electrode of the pull-up transistor.

8. The gate driving circuit of claim 7, wherein the pull-down sub-circuit comprises a pull-down transistor having a gate electrode coupled to the control terminal of the pull-down sub-circuit, a first electrode coupled to the input terminal of the pull-down sub-circuit, and a second electrode coupled to the output terminal of the pull-down sub-circuit, and the pull-down transistor is configured such that the first electrode and the second electrode of the pull-down transistor are electrically connected in response to the first level signal being received at the gate electrode of the pull-down transistor.

9. The gate driving circuit of claim 8, wherein the pull-down control sub-circuit comprises a plurality of pull-down control transistors comprising a first pull-down control transistor, a second pull-down control transistor, a third pull-down control transistor, a fourth pull-down control transistor, a fifth pull-down control transistor and a sixth pull-down control transistor;

the first pull-down control transistor has a gate electrode and a first electrode both coupled to the second level signal terminal, and a second electrode coupled to a gate electrode of the second pull-down control transistor;

the second pull-down control transistor has a first electrode coupled to the second level signal terminal, and a second electrode coupled to the first output terminal of the pull-down control sub-circuit;

the third pull-down control transistor has a gate electrode coupled to the control terminal of the pull-up sub-circuit, a first electrode coupled to the third level signal terminal, and a second electrode coupled to the first output terminal of the pull-down control sub-circuit;

the fourth pull-down control transistor has a gate electrode coupled to the gate electrode of the third pull-down control transistor, a first electrode coupled to the third level signal terminal, and a second electrode coupled to the second electrode of the first pull-down control transistor;

the fifth pull-down control transistor has a gate electrode coupled to the first output terminal of the pull-down control sub-circuit, a first electrode coupled to the third level signal terminal, and a second electrode coupled to the second output terminal of the pull-down control sub-circuit;

the sixth pull-down control transistor has a gate electrode coupled to a control signal terminal, a first electrode coupled to the third level signal terminal and a second electrode coupled to the output terminal of the shift register; and each of the plurality of pull-down control transistors is configured such that the first electrode and the second electrode of the pull-down control transistor are electrically connected in response to the first level signal being received at the gate electrode of the pull-down control transistor.

10. The gate driving circuit of claim 9, wherein the reset sub-circuit comprises a reset transistor having a gate electrode coupled to the control terminal of the reset sub-circuit, a first electrode coupled to a reference signal terminal, and a second electrode coupled to the control terminal of the pull-up sub-circuit, and the reset transistor is configured such that the first electrode and the second electrode of the reset transistor are electrically connected in response to the first level signal being received at the gate electrode of the reset transistor.

11. The gate driving circuit of claim 10, wherein the input sub-circuit comprises an input transistor having a gate electrode coupled to the control terminal of the input sub-circuit, a first electrode coupled to the input terminal of the input sub-circuit, and a second electrode coupled to the control terminal of the pull-up sub-circuit, and the input transistor is configured such that the first electrode and the second electrode of the input transistor are electrically connected in response to a first level signal being received at the gate electrode of the input transistor.

12. A display apparatus, comprising a display panel comprising a plurality of gate lines, and the gate driving circuit according to claim 1, wherein output terminals of the plurality of shift registers in the gate driving circuit are coupled to the plurality of gate lines in one-to-one correspondence, respectively.

13. A method of driving a display apparatus, the display apparatus comprising a display panel and a gate driving circuit,
the display panel comprising a plurality of rows of gate lines sequentially arranged;
the gate driving circuit comprising:
registers and a second group of shift registers, the first group of shift registers being configured to provide scanning signals for odd-numbered rows of gate lines of the plurality of rows of gate lines in the display panel, and the second group of shift registers being configured to provide
a plurality of shift registers, the plurality of shift registers comprising a first group of shift
scanning signals for even-numbered rows of gate lines of the plurality of rows of gate lines in the display panel,
the first group of shift registers comprising a plurality of first subgroups of shift registers, each of which comprises n shift registers, an output terminal of an A-th stage of shift register electrically coupled to an A-th row of gate line being electrically coupled to an input terminal of a (A+n)-th stage of shift register electrically coupled to a (A+n)-th row of gate line, where A is an odd number equal to or larger than 1, and n is a natural number greater than 2;
the second group of shift registers comprising a plurality of second subgroups of shift registers, each of which comprises n shift registers, an output terminal of a (A+1)-th stage of shift register electrically coupled to a (A+1)-th row of gate line being electrically coupled to an input terminal of a (A+1+n)-th stage of shift register electrically coupled to a (A+1+n)-th row of gate line, wherein the n shift registers comprised in each of the plurality of second subgroups of shift registers are different from the n shift registers comprised in each of the plurality of first subgroups of shift registers;
a reset terminal of the A-th stage of shift register being electrically coupled to an output terminal of a (A+a+n)-th stage of shift register electrically coupled to a (A+a+n)-th row of gate line, and a reset terminal of the (A+1)-th stage of shift register being electrically coupled to an output terminal of a (A+a+n+1)-th stage of shift register electrically coupled to a (A+a+n+1)-th row of gate line, where a is a natural number smaller than n/2;
wherein the method comprises:
supplying a plurality of first initial control signals to first ones of shift registers in the first subgroups of shift registers sequentially according to sequential order of stage numbers of the first ones of shift registers in the first subgroups of shift registers;
supplying a plurality of second initial control signals to first ones of shift registers in the second subgroups of shift registers sequentially according to sequential order of stage numbers of the first ones of shift registers in the second subgroups of shift registers;
supplying first clock signals to shift registers in the first group of shift registers sequentially according to sequential order of stage numbers of the shift registers in the first group of shift registers; and
supplying second clock signals to shift registers in the second group of shift registers sequentially according to sequential order of stage numbers of the shift registers in the second group of shift registers.

14. The method of claim 13, wherein for clock signals input to two adjacent stages of shift registers, a clock signal for a next stage of shift register of the two adjacent stages of shift registers is delayed from a clock signal for a current stage of shift register of the two adjacent stages of shift registers by T/n;
a first input second initial control signal is delayed from a first input first initial control signal by T/n, a time interval between two first initial control signals adjacent in time is 2T/n, and a time interval between two second initial control signals adjacent in time is 2T/n; and
wherein T is a duration in which a clock signal is of a first level in one cycle.

15. The method of claim 13, wherein the first clock signal has a duty cycle in a range from 42% to 50%, and the second clock signal has a duty cycle in a range from 42% to 50%.

16. The method of claim 13, wherein n is an even number greater than 2.

17. The method of claim 16, wherein n is equal to 4.

18. The method of claim 17, wherein a is equal to 1.

19. The method of claim 14, wherein the first clock signal has a duty cycle in a range from 42% to 50%, and the second clock signal has a duty cycle in a range from 42% to 50%.

20. The method of claim 14, wherein the first level is a level turning on a transistor in the shift register.

* * * * *